United States Patent
Goldberg et al.

[19]

[11] Patent Number: 6,118,535
[45] Date of Patent: Sep. 12, 2000

[54] IN SITU ALIGNMENT SYSTEM FOR PHASE-SHIFTING POINT-DIFFRACTION INTERFEROMETRY

[76] Inventors: Kenneth Alan Goldberg, 1195 Keeler Ave., Berkeley, Calif. 94708; Patrick P. Naulleau, 5239 Miles Ave., Apt. A, Oakland, Calif. 94618

[21] Appl. No.: 09/324,903

[22] Filed: Jun. 2, 1999

[51] Int. Cl.⁷ ....................................................... G01B 9/02
[52] U.S. Cl. ............................ 356/354; 356/353; 356/359
[58] Field of Search ..................................... 356/353, 354, 356/359

[56] References Cited

U.S. PATENT DOCUMENTS 4,953,981  9/1990  Halen ........................................ 356/353
5,835,217  11/1998  Medecki .

OTHER PUBLICATIONS

Attwood, David et al., "Underulator Radiation for At–Wavelength Interferometry of Optics for Extreme–Ultraviolet Lithography", *Applied Optics*, 32 (34), 7022–7031, 1993.

Goldberg, K.A. et al., "High–Accuracy Interferometry of EUV Lithographic Optical Systems", *J. of Vac. Sci. & Tech. B*, 16 (6), 3435–3439, 1998.

Linnik, W.P., "A Simple Interferometer for the Investigation of Optical Systems", *Applied Optics*, 18 (12), 2010–2012, 1979.

Medecki, H., et al., "Phase–Shifting Point–Diffraction Interferometer", *Optics Letters*, 21 (19), 1526–1528, 1996.

Smartt, R.N., et al., "Theory and Application of Point–Diffraction Interferometers", *Japanese J. of Applied Physics*, 14 Suppl. (14–1), 351–356, 1975.

Speer, R.J., et al., "Grazing Incidence Interferometry: The Use of the Linnik Interferometer for Testing Image–Forming Reflection Systems", *Applied Optics*, 18 (12), 2003–2012, 1979.

*Primary Examiner*—Robert H. Kim
*Attorney, Agent, or Firm*—Burns, Doane, Swecker & Mathis, L.L.P.

[57] ABSTRACT

A device and method to facilitate the gross alignment of patterned object- and image-plane masks in optical systems such as the phase-shifting point diffraction interferometer are provided. When an array of similar pinholes or discreet mask fields is used, confusion can occur over the alignment of the focused beams within the field. Adding to the mask pattern a circumscribed or inscribed set of symbols that are identifiable in situ facilitates the unambiguous gross alignment of the object- and/or image-plane masks. Alternatively, a system of markings can be encoded directly into the window shape to accomplish this same task.

36 Claims, 5 Drawing Sheets

IN SITU ALIGNMENT SYSTEM FOR PHASE-SHIFTING POINT-DIFFRACTION INTERFEROMETRY

The U.S. Government has certain rights in this invention pursuant to Contract No. DE-AC03-76SF00098 between the United States Department of Energy and the University of California for the operation of the Lawrence Berkeley National Laboratory.

BACKGROUND OF THE INVENTION

1. Field of the Invention

The present invention relates to interferometers for making highly accurate measurements of wavefront aberrations, particularly to phase-shifting point diffraction interferometers and rapid methods for in situ, object- and image-plane mask alignment in the interferometers.

2. State of the Art

Optical metrology is the characterization of surfaces and materials using optical methods. An area of optical metrology relevant to the present invention is the use of an interferometer to measure the quality of a test optic, such as a single or multiple element mirror or lens system.

One important recent application of optical metrology is the testing of projection optics for photolithography systems. Modern photolithography systems used to fabricate integrated circuits must continually image smaller features. In pursuit of this goal, systems are confronted with the diffraction limit determined in part by the wavelength of the light employed. To meet the challenge of imaging ever smaller features, photolithographic systems must employ successively shorter wavelengths. Over the history of integrated circuit fabrication technology, photolithography systems have moved from visible to ultraviolet and may eventually move to even shorter wavelengths such as extreme ultraviolet or to yet shorter X-ray radiation.

For the extreme case of X-ray lithography, a proximity method that does not require re-imaging optics is under development. In X-ray proximity lithography, feature sizes are considerably larger than the wavelength limit. However, reticles in this case are required to have feature sizes equal to the desired printed feature size, currently on the order of 0.1 microns and smaller. It is quite difficult and expensive to manufacture reticles having such small feature sizes. Additionally, radiation passing through the reticle's narrow slits and apertures still diverges despite the extremely short wavelength. Thus, the reticles must be placed very close to the wafer, sometimes as close as a few microns, so that the shadow-cast image of the reticle remains sharp on the wafer. These systems must be carefully designed such that the reticle never contacts the wafer, an event that could destroy the reticle.

Because of the difficulties posed by proximity imaging a reticle pattern onto a wafer, it is desirable to extend the concepts of projection optics as currently used in visible-light or deep-ultraviolet lithography systems to even shorter wavelengths such as extreme ultraviolet. Such systems employ lenses or other optical elements to project a demagnified image of the reticle onto the wafer surface. This allows reticles to retain larger feature sizes, thus reducing the expense of generating the reticle itself As with all optical imaging systems, various aberrations such as spherical aberration, astigmatism, and coma may be present. These aberrations must be identified and removed during the fabrication and/or alignment of the projection optics, or the projection optics would introduce substantial blurring in the image projected onto the wafer.

In order to test the projection optics for various aberrations, interferometers may be employed. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram, and the resultant wavefront with, for example, Zernike polynomials, indicates the presence of aberrations.

The reference wave of the interferometer should be "perfect"; that is, it should be simple and well characterized, such as a plane or spherical wave. Unfortunately, beam splitters and other optical elements through which the reference beam passes introduce some deviations from perfection. Thus, the interferogram never solely represents the condition of the test optic. It always contains some artifacts from the optical elements through which the reference wave passes. While these artifacts, in theory, can be separated from the interferogram, it is usually impossible to know that a subtraction produces a truly clean interferogram.

To address this problem, "point diffraction interferometers" have been developed. An example of a point diffraction interferometer is the phase-shifting point diffraction interferometer (PS/PDI) described in H. Medecki, et al., "Phase-Shifting Point Diffraction Interferometer", *Optics Letters*, 21(19), 1526–28 (1996), E. Tejnil, et al., "At-Wavelength Interferometry for EUV Lithography," *J. Vacuum Science & Tech. B*, 15, 2455–2461 (1997), K. A. Goldberg, et al., "Characterization of an EUV Schwarzchild Objective Using Phase-Shifting Point Diffraction Interferometry," *Proceeding SPIE*, 3048, 264–270 (1997), E. Tejnil, et al., "Phase-Shifting Point Diffraction Interferometry for At-Wavelength Testing of Lithographic Optics," *OSA Trends in Optics and Photonics: Extreme Ultraviolet Lithography*, Optical Society of America, Wash. D.C., 4, 118–123 (1996), K. A. Goldberg, "Extreme Ultraviolet Interferometry", doctoral dissertation, Dept. of Physics, Univ. of California, Berkeley (1997), and in the U.S. Pat. No. 5,835,217 "Phase-Shifting Point Diffraction Interferometer", Inventor Hector Medecki, which are all incorporated herein by reference.

Figures 1A, 1B:
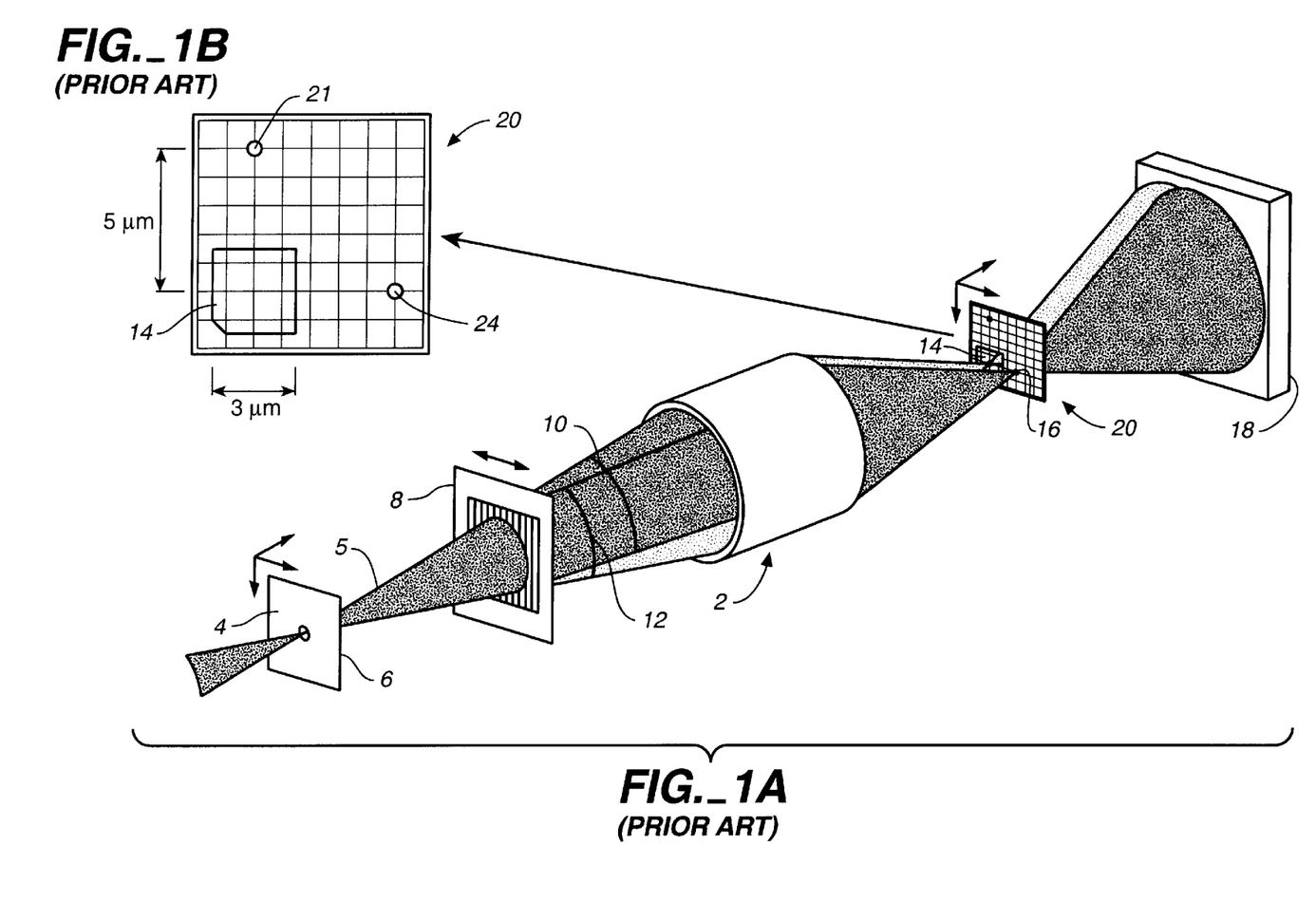
FIG. 1A is a schematic of a prior art phase-shifting point diffraction interferometer.
FIG. 1B illustrates a prior art phase-shifting point diffraction interferometer mask.

The PS/PDI is a variation of the conventional point diffraction interferometer in which a transmission grating has been added to greatly improve the optical throughput of the system and add phase-shifting capability. In the PS/PDI, as illustrated in FIG. 1A, the optical system 2 under test is illuminated by a spherical wave 5 that is generated by an entrance pinhole 6 in a mask 4 that is placed in the object plane of the optical system 2. To assure the quality of the spherical wave illumination, pinhole 6 is chosen to be several times smaller than the resolution limit of the optical system. Grating 8 splits the illuminating beam 5 to create the required test and reference beams 10 and 12, respectively. A PS/PDI mask 20 is placed in the image plane of the optical system 2 to block the unwanted diffracted orders generated by the grating 8 and to spatially filter the reference beam 12 using a reference pinhole 16. The test beam 10, which contains the aberrations imparted by the optical system, is largely undisturbed by the image plane mask by virtue of it passing through a window 14 in the PS/PDI mask 20 that is large relative to the point-spread function of the optical system. The test and reference beams propagate to the mixing plane where they overlap to create an interference pattern recorded on a CCD detector 18. The recorded interferogram yields information on the deviation of the test beam from the reference beam which in the ideal case is a spherical wave. FIG. 1B depicts a PS/PDI mask 20 comprising a square shaped window 14 and reference pinholes 21 and 24 and that are placed at 90 degrees for measurement in two orthogonal directions. The window also includes a symmetry-breaking feature in the lower left corner of the window to identify the corner opposite the reference pinholes.

The accuracy of the PS/PDI measurement system comes from the pinhole-diffraction-generated reference and illumination beams. This type of high-accuracy interferometer can be implemented in any spectral regime.

In practice, component alignment is the most challenging aspect of using the PS/PDI. Measuring high-resolution optical systems interferometrically requires the use of spatial-filter pinholes that are smaller than the diffraction-limited resolution. For example, accurate measurement of an advanced lithographic optical system, such as an extreme ultraviolet (EUV) projection system operating near 13-nm wavelength, requires pinholes below 100-nm in diameter. Alignment of these pinholes necessitates the use of translation stages capable of controlled motion on the same size scale.

In order to facilitate this most difficult aspect of measurement, and in order to incorporate a range of suitably-sized pinholes into the image-lane, a pinhole mask has been created that consists of an array of pinhole and window fields arranged in a rectangular grid, and spaced with sufficient clearance to allow the use of one individual field at a time. The existence of the pinhole array enables the optimal pinhole diameter to be selected in situ. A variant of this design, configured for the PS/PDI with square windows adjacent to each pinhole has been used in the measurement of prototype EUV lithographic imaging systems.

While the introduction of the pinhole array has many practical advantages, confusion frequently occurs regarding which of the field points is being illuminated. Intentional or accidental adjustment of the illumination source, the object pinhole, or the optical system can cause the interferometer-user to lose track of the position of the focused beam in the image-plane, and therefore also lose track of the beam's position within the pinhole array. The great similarity among the pinhole fields in the array contributes to this difficulty. When the position (or knowledge thereof) is lost, one method of re-establishing the alignment is to systematically translate the array (or the illuminating beam) from field to field, while counting the rows and columns until the corner is reached. Although this method does work, it is very time-consuming.

SUMMARY OF THE PRESENT INVENTION

The invention is based in part on the recognition that the addition of patterned row-and column-identifying symbols can remove the alignment ambiguity of object-or image-plane pinhole mask arrays used in point-diffraction interferometers. The new system presented here gives the interferometer user rapid access to position information. A Fast-Fourier Transform (FFT) is used to "read" identifying marks in the mask when the interferometer is in focus for measurement.

Accordingly, in one embodiment, the invention is directed to an optical system defining an optical path that includes:

(a) a source of electromagnetic energy in the optical path;

(b) an optical element in the optical path;

(c) at least one of an object mask that is located near the object plane of the optical system or an image mask that is located near the image plane of the optical system wherein the at least one object mask or image mask comprises a patterned screen that defines an array of different sized apertures and a corresponding set of symbols that identify the different sized apertures in said array; and (d) means for detecting an intensity pattern created by the set of symbols.

In another embodiment, the invention is directed to a phase-shifting point diffraction interferometer system that defines an optical path, said system including:

(a) a source of electromagnetic energy in the optical path;

(b) a beam divider in the optical path for dividing electromagnetic radiation from the source into a reference beam and a test beam;

(c) an image mask that is positioned in the image plane of an optical element under test wherein the image mask defines an array of test window and reference beam pinhole pairs and a corresponding set of first symbols that identify the different pairs in said array; and (d) means for detecting an intensity pattern created by the set of first symbols.

In a preferred embodiment, the system further includes:

(e) an object mask that is positioned in the object plane of the optical element wherein the object mask defines a second array of object pinholes and a corresponding set of second symbols that identify the different pairs in said second array; and (f) means for detecting a second intensity pattern created by the set of second symbols.

In yet another embodiment, the invention is directed to a method of aligning an optical system defining an optical path that includes (i) a source of electromagnetic energy in the optical path, (ii) an optical element in the optical path and (iii) means for detecting an intensity pattern created by the set of symbols that includes the steps of:

(a) providing at least one of an object mask that is located near the object plane of the optical system or an image mask that is located near the image plane of the optical system wherein the at least one object mask or image mask comprises a patterned screen that defines an array of apertures and a corresponding set of symbols that identify the apertures and/or pinhole locations in said array; and (b) moving the image mask; and (c) detecting intensity patterns created by the set of symbols.

In a further embodiment, the invention is directed to a method of aligning a phase-shifting point diffraction interferometer defining an optical path that includes (i) a source of electromagnetic energy in the optical path, (ii) a beam divider in the optical path for dividing electromagnetic radiation from the source into a reference beam and a test beam, and (iii) an optical element under test in the optical path, wherein the method includes the steps of.

(a) positioning an image mask in the image plane of the optical system under test wherein the mask defines an array of test window and reference beam pinhole pairs and a corresponding set of first symbols that identify the different pairs in said array;

(b) moving the image mask; and (c) detecting intensity patterns created by the set of first symbols.

BRIEF DESCRIPTION OF THE DRAWINGS

The present invention may be further understood from the following description in conjunction with the appending drawing.

DETAILED DESCRIPTION OF THE PREFERRED EMBODIMENTS

Figure 2:
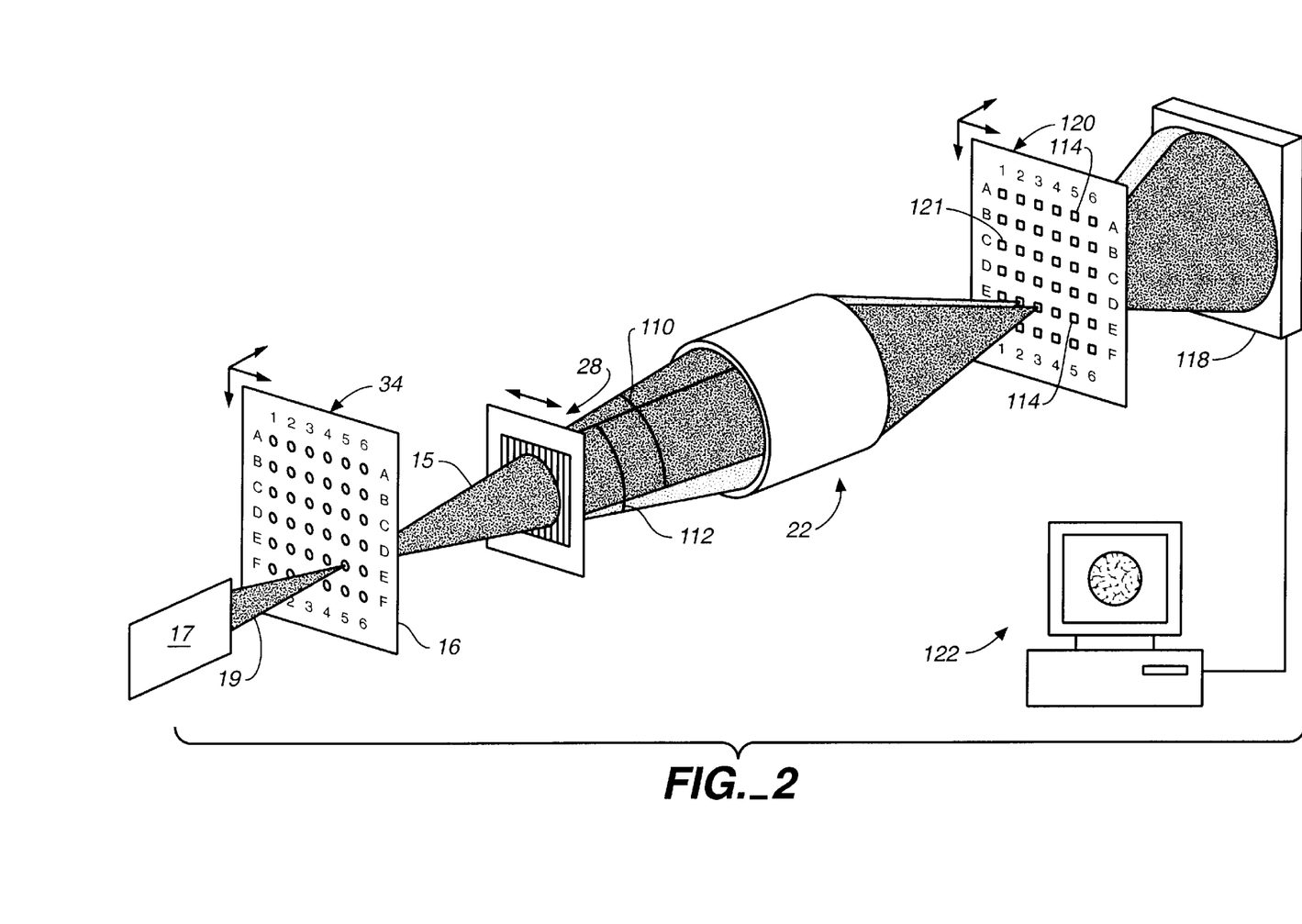
FIG. 2 illustrates a phase-shifting point diffraction interferometer employing arrays of pinholes or mask patterns in the object and images planes.

A PS/PDI system implementing the in situ alignment system is illustrated in FIG. 2. The system includes a source of electromagnetic radiation 17 which directs a beam 19 onto an entrance pinhole 16 located in object mask 34 that is placed in the object plane of the optical system 22. As will be described further, the object mask comprises a plurality of pinholes 16 (or field of pinholes). If the entrance pinhole is sufficiently small, the electromagnetic radiation 15 transmitted through the entrance pinhole 16 is spatially coherent and essentially spherical. To this end, the entrance pinhole 16 is chosen to be several times smaller than the resolution limit of the optical system. The optical system 22 under test is illuminated by the essentially spherical wave 15. Beam divider 28, e.g., a transmission grating, splits the illuminating beam 15 to create the required test and reference beams 110 and 112, respectively. An image mask 120 comprising an array test window and reference pinhole(s) pair 121 is placed in the image plane of the optical system 22 to block the unwanted diffracted orders generated by the beam divider 28 and to spatially filter the test and reference beams 110 and 112, respectively.

The test and reference beams propagate to the mixing plane where they overlap to create an interference pattern recorded on an intensity detector 118. Examples of intensity detectors include a camera with a photosensitive film, and a Vidicon camera. A preferred detector is a charged-couple device (CCD). The PS/PDI also includes a computer system 122 having a monitor and software for recording and analyzing the interferograms.

Each pinhole in the field of pinholes of the object mask 34 is usually in the range of $1/100$ to 2 times $\lambda/NA$ in diameter where NA is the object-side NA. The pinholes are created by, for example, electron beam lithography and reactive ion etching. The pinholes are separated by sufficient distance to enable them to be used one at a time. Preferably, the pinholes, which can be of different sizes, are arranged in the array in an orderly fashion such as forming the smallest one at the upper left corner and the largest one at the lower right of the object mask, however, it is understood that the pinholes can be arranged in any order. The only requirement is that sizes of the pinholes can be identified by symbols as described herein. In one embodiment, the object mask comprises a 200-nm-thick Ni absorbing layer evaporated on a 100 nm $Si_3N_4$ membrane. The object mask features are etched completely through the membrane prior to the Ni evaporation. Thus, the pinholes are completely open in the finished object mask, maximizing their transmission.

The image mask 120 comprises a field of test windows 114 and associated reference pinhole pairs (not shown). In the simplest case, each window 114 has a single corresponding reference pinhole; however, two or more reference pinholes can be employed. Each window 114 in the field preferably has two reference pinholes that are placed at 90 degrees for measurement in two orthogonal directions like reference pinholes 21 and 24 in Fig. 1A. Typically, the windows can have an area ranging from about 10 to 1000 times $\lambda/NA$, and preferably from about $3 \times 3$ $\mu m^2$ to $5 \times 5$ $\mu m^2$ where the system is used at EUV wavelength. The reference pinholes can have a diameter in the range from about $1/100$ to 2 times $\lambda/NA$ and preferably from about 25 to 500 nm at EUV wavelength.

For EUV photolithography, the radiation employed typically has a short wavelength in the range of about 5 nm to 15 nm and in current prototype systems has a wavelength of about 13.4 nm. When employing radiation of this short wavelength, the diameter of the pinholes in the object mask field typically ranges from about $1/10$ to 2 times $\lambda/NA$, (where NA is the numerical aperture on the object side) and preferably ranges form about 200 nm to 2000 nm.

It should be particularly noted that all the specific window sizes, pinhole sizes, and separations stated here have been chosen based on our implementation of testing 0.1 NA EUV lithographic optical systems. The optimal parameters will vary as a function of application.

PS/PDI systems may be configured many different ways. The source of electromagnetic radiation may be, for example, a laser or some other quasi-monochromatic source. If the source of radiation provides a spherical wave, the interferometer does not need to include the entrance pinhole through which radiation passes before it illuminates the test optic as described above.

The beam divider is preferably, though not necessarily, located between the source of electromagnetic radiation and the test optic region. Examples of suitable beam dividers include reflection type diffraction gratings, transmission type diffraction gratings, and polarization beamsplitters.

While the invention is being described as implemented in a PS/PDI, as is apparent, the invention is applicable to point-diffraction interferometers generally. Indeed, the invention can be employed in other optical systems that require the alignment of an object-or image-plane "mask" having discreet fields, where the optical system has a CCD or similar detector on the image-side, with or without reimaging optics. As used generally, "mask" refers to a patterned screen, including spatial filters, used in transmission or reflection, and is located near the object and/or image plane.

Novel Alignment Marks

Three preferred mask designs to implement gross alignment are detailed here. These masks include identifying symbols (letters, numbers, symbols, etc.) in the mask pattern that can be read in situ during alignment. Marks can also be used to indicate pinhole positions for fine alignment of the PS/PDI.

Circumscribed or Inscribed Symbols.

Figure 3A:
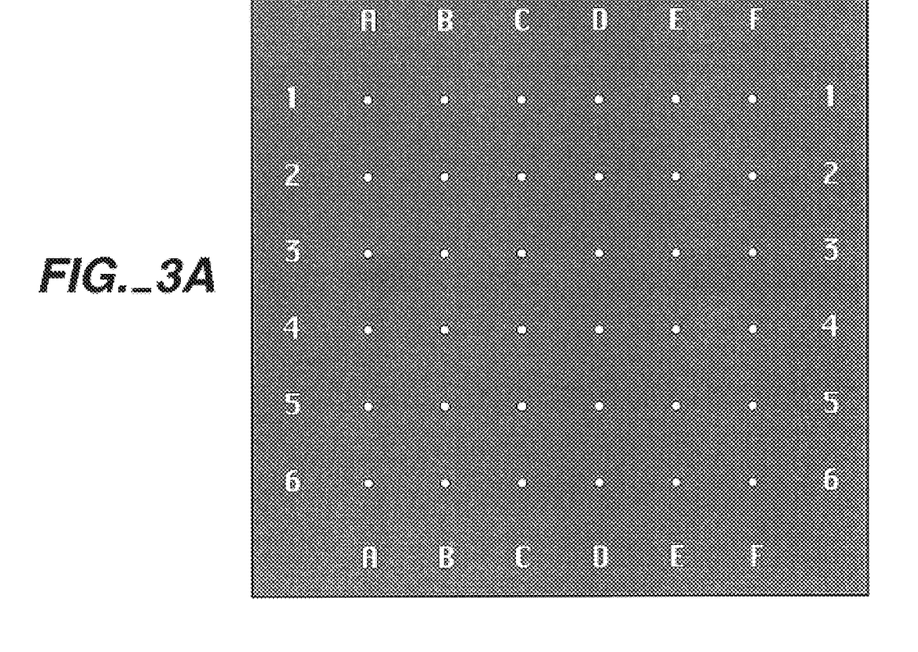
FIGS. 3A and 3B are diagrams showing alignment marks that are circumscribed and inscribed in the mask.
Figure 3B:
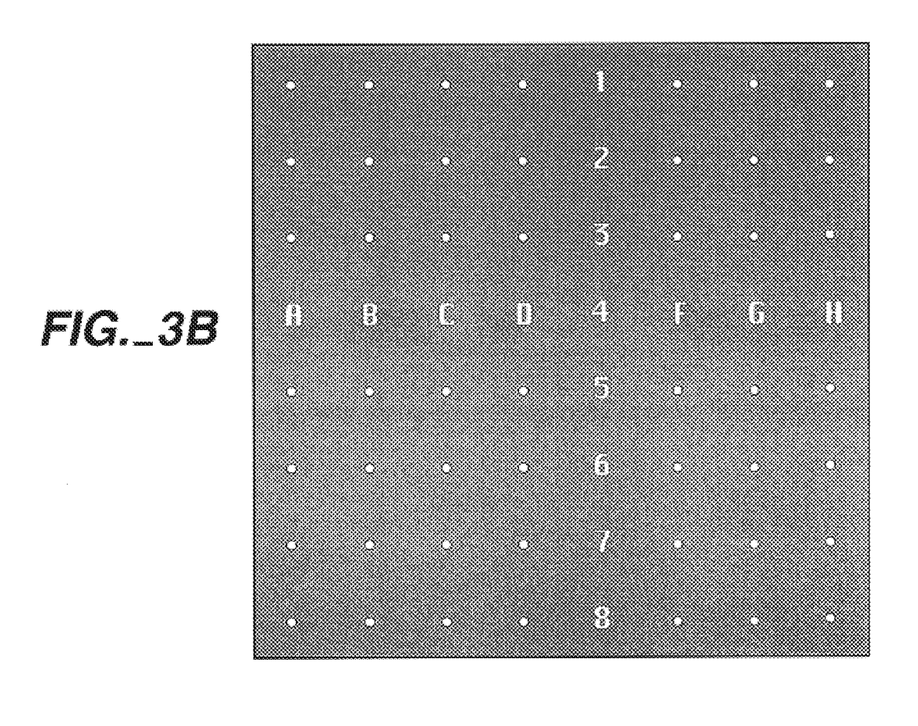

FIGS. 3A and 3B depict masks that contain a plurality or field of pinholes. The masks incorporate a set of circumscribed or inscribed symbols into the pinhole pattern which allows for rapid identification of the occupied row or column. In the circumscribed case as shown in FIG. 3A, the symbols can be placed at the positions of the outermost rows or columns of a square array. The inscribed case as shown in FIG. 3B calls for the symbols to occupy accessible positions within the array. These symbols are patterned into the opaque membrane as transparent regions in the same manner as the other mask features, and are stenciled images of the letters or numbers they represent.

The inscribed embodiment offers some advantages. Since the identifying marks do not surround the pattern, space-constrained arrays may cover a larger area. In some experimental cases, the limited travel ranges of high-accuracy stages may make it difficult to place the center of the patterned mask at the center of the optical field-of-view. In such instances, the stage may not allow the observation of the pinholes or features at the ends of the rows.

Interstitial Symbols

Figure 4:
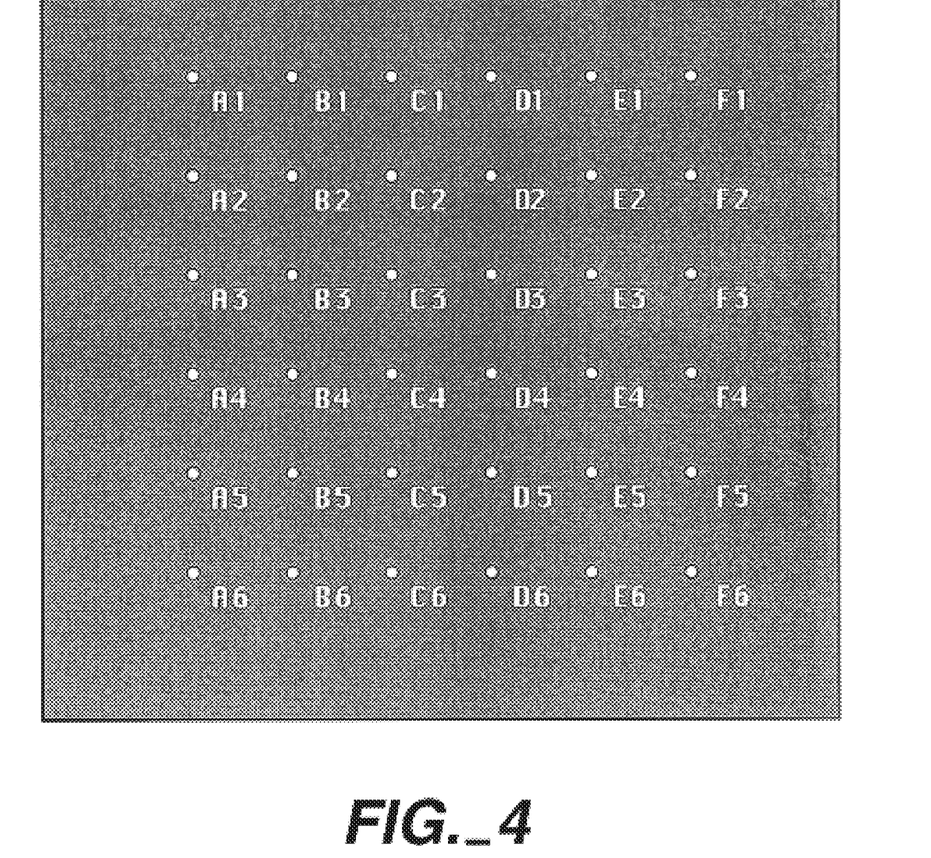
FIG. 4 is a diagram showing alignment marks that are interspersed adjacent to individual field points in the mask.

A second design uses small marks that accompany each pinhole in the field as shown in FIG. 4. These marks are judiciously placed to avoid the unintentional leakage of light through the mark during interferometric measurement.

Row and Column Encoding

Figure 5:
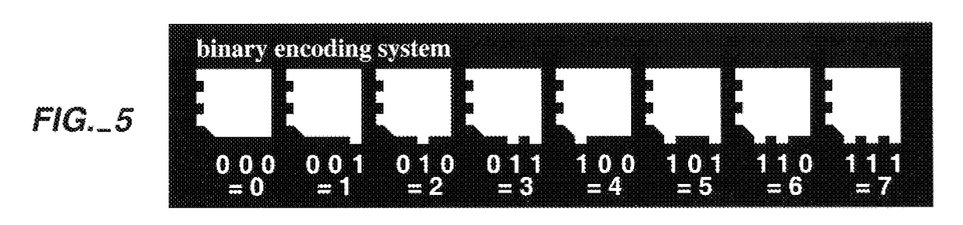
FIG. 5 depicts a three-bit binary code that is written into small protrusions along the edges of a test window.

An embodiment that is particulary suited for use in the image mask encodes the row and column information into the shape of the window through which the test beam passes. For arbitrary window placement patterns, a window index may be encoded into the window shape. One example of this encoding is shown in FIG. 5. Here a simple three-bit binary code is written into small protrusions along the edges of a window. The symmetry-breaking lower right corner serves to identify the most-significant bit for encoded symbols along two sides of the window. The example in FIG. 5 shows a detail of the eight windows in the seventh row of a window array.

The positions and shapes of the protrusions can be chosen to aid in the in situ location at the reference pinholes.

During alignment, when the focused beam passes close to or through a stenciled symbol, the symbols can be identified by observing the Fourier-transform of the detected intensity pattern. Owing to the detector's location in the far-field of the image-plane, this Fourier-transform (rapidly calculable using the Fast-Fourier Transform, or FFT) is simply the auto-correlation of the field in the image-plane. The magnitude of the observed Fourier-transform creates a pseudo-image of the image-plane: this image reveals the identifying symbol super-imposed with a polar-symmetric copy of itself mirrored about the beam's focus. This method of image reconstruction is similar to Fourier-transform off-axis holography.

A second method of observing the alignment marks is available. When the mask containing the alignment marks is intentionally displaced from the focal plane, to a position where the beam illuminates one or more marks, the geometric shadow of the illuminated mask pattern will be projected onto the detector. The alignment marks can be identified "directly" in the recorded illumination pattern without the necessity of using a Fourier-transform pseudo-image to observe them.

The usefulness of the alignment marks described here depends on the characteristics of the focused light in the plane of the marks. To identify the stenciled symbols in the Fourier-transform, the width of the focused beam must be equal to or smaller than the width of the stenciled patterns. As observed in the Fourier-transform, the stenciled pattern is convolved with the beam shape; features smaller than the beam width may be blurred beyond recognition. The consequences of this fact place limitations on the beam shape and stencil size in the plane of the marks. A broad beam, wider than the stenciled lines cannot be used. Furthermore, a narrow beam cannot be used if it is far from focus, where the beam width is relatively large. The beam-size limitation is usually not important for image-plane alignment marks when the optical system is of high quality, and the beam is tightly focused. However, in the object plane, where the illumination quality in the vicinity of the entrance pinhole spatial filter may be poor, this alignment mark system may be difficult or impossible to apply.

In systems where the beam size is much narrower than the alignment marks, the observation of the marks is improved by the presence of flare and scattering from the optical system. This excess light illuminates the entire identification symbol with a low light level more effectively than would the illumination from an ideal scatter-free system.

Alignment Mark Observation

Figure 6:
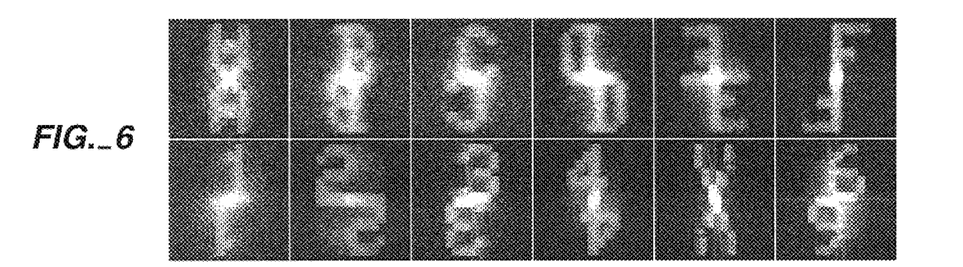
FIG. 6 shows the logarithmically-scaled FFTs of the alignment marks demonstrating how they can be read in situ.

To test the effectiveness of this alignment method, an image mask was fabricated containing both an array of encoded windows, and circumscribing symbols. The mask was installed in the EUV PS/PDI configured for the measurement of a 10×-demagnification Schwarzschild objective, operating at 13.4-nm wavelength. During alignment and data collection, the FFTs of the recorded intensity patterns are calculated and observed on a computer. The alignment marks contained in the image-plane mask are clearly visible in the FFT image. The circumscribed row- and column-identifying symbols from a 6×6 field array are shown in FIG. 6 as an illustration of how the alignment marks are read in situ. Here the logarithmically-scaled magnitudes of the FFTs are shown for each symbol in order to reveal the weaker signal in the alignment marks in the presence of the strong central peak of the focused beam. As stated above, the presence of scattered light improves the efficacy of this method by increasing the amount of light passing through the potentially wide symbols. In fact, to observe features that may be somewhat far laterally from the focus, this method relies on either the presence of scattered light, or on the high dynamic range of the detector.

The image-plane mask symbols that were used to generate the images of FIG. 6 are each 5 $\mu$m tall. The height of the letters should be chosen so as not to exceed the spatial-frequency range of the detector, determined by the pixel size. If the letters are larger than $\delta\lambda/2$, where $\lambda$ is the wavelength, and $\delta$ is the angle subtended by a single detector element, then the symbol will extend beyond the boundaries of the FFT. Similarly, the widths of the letter features must not be narrower than allowed by the collection angle of the detector. This width must be larger than $\lambda/(2\ NA)$, where NA is the numerical aperture. The letter "V" is used for "5" to avoid possible confusion with the number "2".

As shown, the symbols identify both the row and the column of the field point. The use of Roman letters and Arabic numerals is just one possibility. Any unambiguous system of symbols can be used to identify the individual fields. Given the polar symmetry of the FFT used to identify the symbols, it may be beneficial to exclude certain symbols that possess a high degree of symmetry, or that resemble other distinct symbols too closely.

Figure 7:
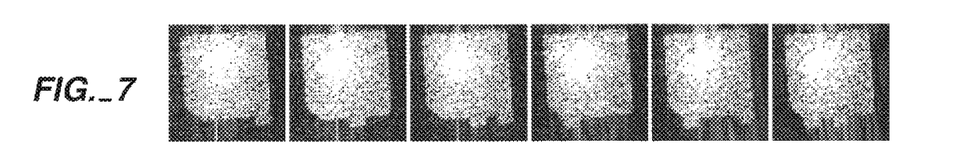
FIG. 7 show the logarithmically-scaled FFTs of the encoded windows of FIG. 2.

FIG. 7 illustrates the system of encoded windows described above. These details of FFT images were recorded during interferometric measurement. The encoded marks are designed to project 0.33 μm from the square window edge, and they are clearly visible. Specifically, the logarithmically-scaled FFTs of the encoded windows demonstrate how they are read in situ. From left to right, the "teeth" on the lower edge of the windows represent 001, 010, 011, 100, 101, and 110, the numbers 1 through 6, respectively.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An optical system defining an optical path that comprises:

(a) a source of electromagnetic energy in the optical path;
    (b) an optical element in the optical path;
    (c) at least one of an object mask that is located near the object plane of the optical system or an image mask that is located near the image plane of the optical system wherein the at least one object mask or image mask comprises a patterned screen that defines an array of different sized apertures and a corresponding set of symbols that identify the different sized apertures in said array; and
    (d) an intensity detector.

2. The optical system of claim 1 wherein the intensity detector comprises means for detecting the intensity pattern created by the set of symbols.

3. The optical system of claim 1 wherein the detector comprises a charged coupled device.

4. A phase-shifting point diffraction interferometer system that defines an optical path, said system comprising:

(a) a source of electromagnetic energy in the optical path;
    (b) a beam divider in the optical path for dividing electromagnetic radiation from the source into a reference beam and a test beam;
    (c) an image mask that is positioned in the image plane of an optical element under test wherein the image mask defines an array of test window and reference beam pinhole pairs and a corresponding set of first symbols that identify the different pairs in said array; and
    (d) means for detecting an intensity pattern created by the set of first symbols.

5. The system of claim 4 further comprising:

(e) an object mask that is positioned in the object plane of the optical element wherein the object mask defines a second array of object pinholes and a corresponding set of second symbols that identify the different pairs in said second array; and
    (f) means for detecting a second intensity pattern created by the set of second symbols.

6. The system of claim 4 wherein the first symbols of the image mask are incorporated along the perimeter of the image mask.

7. The system of claim 4 wherein the first symbols of the image mask are incorporated in an interior region of the image mask.

8. The system of claim 4 wherein the first symbols of the image mask are incorporated adjacent to the test window and reference pinhole pairs.

9. The system of claim 4 wherein the first symbols of the image mask are incorporated in an interior region of the image mask.

10. The system of claim 4 wherein each test window has an opening and the first symbols comprise protrusions along the perimeter of the opening.

11. The system of claim 4 wherein the means for detecting the intensity pattern comprises an intensity recording device or medium.

12. The system of claim 4 wherein the means for detecting the intensity pattern comprises a charged coupled device.

13. The system of claim 4 wherein the beam divider is a diffraction grating.

14. The system of claim 4 wherein the diffraction grating is positioned between the source of the electromagnetic radiation and the optical element.

15. The system of claim 4 wherein each window defines an opening with an area of about 5 to 1000 times $\lambda$/NA wherein NA is the object-side numerical aperture.

16. The system of claim 4 wherein the reference pinholes each has a diameter of about $\frac{1}{100}$ to 2 times $\lambda$/NA wherein NA is the object-side numerical aperture.

17. The system of claim 6 wherein the object pinholes each has a diameter of about $\frac{1}{100}$ to 2 times $\lambda$/NA wherein NA is the object-side numerical aperture.

18. The system of claim 10 wherein each window is a square-shaped opening.

19. A method of aligning an optical system defining an optical path that includes (i) a source of electromagnetic energy in the optical path, (ii) an optical element in the optical path and (iii) means for detecting an intensity pattern created by the set of symbols that comprises the steps of:

(a) providing at least one of an object mask that is located near the object plane of the optical system or an image mask that is located near the image plane of the optical system wherein the at least one object mask or image mask comprises a patterned screen that defines an array of apertures and a corresponding set of symbols that identify at least one of (i) the aperture locations in said array or (ii) the pinhole locations in said array and
    (b) moving the image mask; and
    (c) detecting intensity patterns created by the set of symbols.

20. The method of claim 19 wherein the means for detecting the intensity pattern comprises an intensity recording device or medium.

21. The method of claim 19 wherein the means for detecting the intensity pattern comprises a charged coupled device.

22. A method of aligning a phase-shifting point diffraction interferometer defining an optical path that includes (i) a source of electromagnetic energy in the optical path, (ii) a beam divider in the optical path for dividing electromagnetic radiation from the source into a reference beam and a test beam, and (iii) an optical element under test in the optical path, wherein the method comprises the steps of:

(a) positioning an image mask in the image plane of the optical system under test wherein the mask defines an array of test window and reference beam pinhole pairs and a corresponding set of first symbols that identify the different pairs in said array;
    (b) moving the image mask; and
    (c) detecting intensity patterns created by the set of first symbols.

23. The method of claim 22 further comprising the steps of:

(f) positioning an object mask in the object plane of the optical element wherein the object mask defines a second array of object pinholes and a corresponding set of second symbols that identify the different pairs in said second array; and (g) for detecting a second intensity pattern created by the set of second symbols.

24. The method of claim 22 wherein the first symbols of the image mask are incorporated along the perimeter of the image mask.

25. The method of claim 22 wherein the first symbols of the image mask are incorporated in an interior region of the image mask.

26. The method of claim 22 wherein the first symbols of the image mask are incorporated adjacent the test window and reference pinhole pairs.

27. The method of claim 22 wherein the first symbols of the image mask are incorporated in an interior region of the image mask.

28. The method of claim 22 wherein each test window has an opening and the first symbols comprise protrusions along the perimeter of the opening.

29. The method of claim 22 wherein the step of detecting the intensity pattern employs an intensity recording device or medium.

30. The method of claim 22 wherein the step of detecting the intensity pattern comprises a charged coupled device.

31. The method of claim 22 wherein the beam divider is a diffraction grating.

32. The method of claim 22 wherein the diffraction grating is positioned between the source of the electromagnetic radiation and the optical element.

33. The method of claim 22 wherein each window defines an opening with an area of about 5 to 1000 times $\lambda/NA$ wherein NA is the object-side numerical aperture.

34. The method of claim 22 wherein the reference pinholes each has a diameter of about $1/100$ to 2 times $\lambda/NA$ wherein NA is the object-side numerical aperture.

35. The method of claim 24 wherein the object pinholes each has a diameter of about $1/100$ to 2 times $\lambda/NA$ wherein NA is the object-side numerical aperture.

36. The method of claim 28 wherein each window is a square-shaped opening.

* * * * *